(12) United States Patent
Iqbal et al.

(10) Patent No.: US 11,316,430 B2
(45) Date of Patent: Apr. 26, 2022

(54) DC TO DC SWITCHED INDUCTOR BOOST CONVERTER

(71) Applicant: QATAR UNIVERSITY, Doha (QA)

(72) Inventors: Atif Iqbal, Up (QA); Shima Sadaf, West Bengal (IN); Nasser Al-Emadi, Doha (QA); Mahajan Sagar Bhaskar, Maharashtra (IN); Mohammad Meraj, Telangana (IN)

(73) Assignee: QATAR UNIVERSITY, Doha (QA)

( * ) Notice: Subject to any disclaimer, the term of this patent is extended or adjusted under 35 U.S.C. 154(b) by 183 days.

(21) Appl. No.: 16/834,650

(22) Filed: Mar. 30, 2020

(65) Prior Publication Data

US 2021/0313890 A1 Oct. 7, 2021

(51) Int. Cl.
*H02M 3/158* (2006.01)
*H01L 29/861* (2006.01)
*H02M 1/00* (2006.01)

(52) U.S. Cl.
CPC ....... *H02M 3/1584* (2013.01); *H01L 29/8611* (2013.01); *H02M 1/0006* (2021.05)

(58) Field of Classification Search
None
See application file for complete search history.

(56) References Cited

U.S. PATENT DOCUMENTS 8,917,075 B2 12/2014 Leipold et al.
9,331,562 B2 * 5/2016 Liu .................... H02M 1/12
2009/0091952 A1 4/2009 Yoshida
(Continued)

FOREIGN PATENT DOCUMENTS

CN 106712503 A 5/2017
CN 206698111 U 12/2017
(Continued)

OTHER PUBLICATIONS

Boris Axelrod et al., "Switched-Capacitor/Switched-Inductor Structures for Getting Transformerless Hybrid DC-DC PWM Converters", IEEE Transactions on Circuits and Systems—I: Regular Papers, vol. 55, No. 2, Mar. 2008, 10 pages, DOI: 10.1109/TCSI.2008.916403.
(Continued)

*Primary Examiner* — Jeffrey A Gblende
(74) *Attorney, Agent, or Firm* — Squire Patton Boggs (US) LLP

(57) ABSTRACT

A DC-DC switched inductor boost converter with reduced switch voltage stress including two inductors and two active switches. The two inductors may be configured to charge in parallel when the two active switches are turned on, and the two inductors may be configured to discharge in series when the two active switches are turned off. A Switched Inductor Boost (SI-B) converter is proposed with reduced voltage stress across active switches to achieve higher output voltage. The SI-B converter configuration is transformer-less and derived by replacing the diode of the classical switched inductor structure with an active switch. As a result, compared to the existing transformer-less high step-up converter or switched inductor boost converter, certain embodiments have the merit that the switch voltage stress across the active switch is less than the output voltage.

14 Claims, 7 Drawing Sheets

(56) References Cited

U.S. PATENT DOCUMENTS

| | | |
|---|---|---|
| 2010/0201333 A1 | 8/2010 | Sato |
| 2012/0243279 A1 | 9/2012 | Zacharias et al. |
| 2015/0180340 A1 | 6/2015 | Ernest et al. |
| 2018/0097438 A1 | 4/2018 | Iljima |
| 2019/0146541 A1 | 5/2019 | Cai et al. |
| 2019/0182957 A1 | 6/2019 | Sturcken et al. |

FOREIGN PATENT DOCUMENTS

| | | | |
|---|---|---|---|
| CN | 105529925 B | * | 4/2019 |
| CN | 110504833 A | * | 11/2019 |

OTHER PUBLICATIONS

Fernando Lessa Tofoli et al., "Survey on Non-Isolated High-voltage Step-up DC-DC Topologies Based on the Boost Converter", IET Power Electronics, IET Journals, The Institute of Engineering and Technology, ISSN: 1755-4535, DOI: 10.1049/iet-pel.2014.0605, www.ietdl.org, 14 pages.

M. Lakshmi et al., "Nonisolated High Gain DC-DC Converter for DC Microgrids", IEEE Transactions on Industrial Electronics, vol. 65, No. 2, Feb. 2018, 8 pages, DOI: 10.1109/TIE.2017.2733463, http://www.ieee.org/publications.standards/publications/rights/index.html.

Transactions on Industrial Electronics, IEEE Transactions on Industrial Electronics, "A Novel Modified Switched Inductor Boost Converter with Reduced Switch Voltage Stress", 10 pages, ScholarOne Manuscripts.

* cited by examiner

DC TO DC SWITCHED INDUCTOR BOOST CONVERTER

FIELD OF THE INVENTION

Certain embodiments may generally relate to a direct current-to-direct current (DC-DC) boost converter with high voltage conversion ratio to achieve the required voltage level from a low voltage source. More specifically, certain embodiments may generally relate to a DC-DC switched inductor boost converter with reduced switch voltage stress.

BACKGROUND OF THE INVENTION

In many applications (e.g., photovoltaic, fuel cell energy conversion, uninterruptible power supply, DC microgrid, automobile, high intensity discharged lamp ballast, hybrid vehicle, etc. . . . ), a DC-DC boost converter with high voltage conversion ratio is employed to achieve the necessary voltage level from a low voltage source. In practice, a conventional boost converter is not a feasible solution to achieve a high voltage conversion ratio because the voltage conversion ratio is restricted due to the problems created by the reverse recovery of the rectifier diode, electromagnetic interferences, use of extreme duty cycle (closer to unity), high conduction loss at a switch, and the effects of the effective series resistance of inductor and capacitor etc.

Several boosting techniques using isolated converters (e.g., transformer and coupled inductor, flyback, and push-pull) have been proposed in literature as solutions to the problems of conventional boost converters. However, these configurations are bulky and large in size and cause the active switches of these converters to suffer from high voltage stress due to transformer leakage inductance. Consequently, additional energy regeneration techniques and voltage clamping techniques are required to recycle the leakage energy and minimize the voltage stress of active switches.

Non-isolated configurations (e.g., cascade configurations, quadratic boost, switched capacitor, switched inductor, and hybrid switched inductor/capacitor) are some of the recently proposed solutions to overcome the drawbacks of isolated configurations. However, in most of the above-stated cases, several power stages are required and the voltage stress across active switches is equal to the total output voltage. Therefore, there is a need for a DC-DC boost converter for step-up voltage applications with reduced voltage stress across active switches.

SUMMARY OF THE INVENTION

One embodiment may be directed to a DC-DC converter. The DC-DC converter may include two inductors and two active switches. The two inductors may be configured to charge in parallel when the two active switches are turned on, and the two inductors are configured to discharge in series when the two active switches are turned off.

Another embodiment may be directed to a method. The method may include providing a direct current to direct current converter that includes two inductors and two active switches. The method may also include charging the two inductors in parallel when the two active switches are turned on, and discharging the two inductors in a series when the two active switches are turned off.

BRIEF DESCRIPTION OF THE DRAWINGS

The accompanying drawings, which are included to provide a further understanding of example embodiments and are incorporated in and constitute a part of this specification, illustrate certain embodiments of the invention and together with the detailed description serve to explain the principles of certain embodiments. In the drawings.

DETAILED DESCRIPTION OF THE INVENTION

In the following detailed description of the illustrative embodiments, reference is made to the accompanying drawings that form a part hereof. These embodiments are described in sufficient detail to enable those skilled in the art to practice the invention, and it is understood that other embodiments may be utilized and that logical or structural changes may be made without departing from the spirit or scope of this disclosure. To avoid detail not necessary to enable those skilled in the art to practice the embodiments described herein, the description may omit certain information known to those skilled in the art. The following detailed description is, therefore, not to be taken in a limiting sense.

The features, structures, or characteristics of the invention described throughout this specification may be combined in any suitable manner in one or more embodiments. For example, the usage of the phrases "certain embodiments," "some embodiments," or other similar language, throughout this specification refers to the fact that a particular feature, structure, or characteristic described in connection with the embodiment may be included in at least one embodiment of the present invention.

Certain embodiments may provide a configuration of a power electronic DC-DC boost converter for step-up voltage applications with reduced voltage stress across active switches. The proposed power electronic converter, also referred to as switch inductor boost ("SI-B") converter, is transformer-less and may be derived by replacing a diode of the switched inductor with an active switch. The resultant SI-B converter, when compared with conventional transformer-less high step-up converters under the same operating conditions (e.g., input voltage, output voltage, and output power), produces a more favorable switch voltage stress across the active switch that is less than the output voltage.

In an embodiment, the DC-DC converter topology is proposed to reduce the voltage stress across the active switches and for efficient use in power management systems by modifying the structure of single switched SI-B converters. Therefore, according to certain embodiments, there is no requirement of an additional gate driver, control logic, and control circuitry.

Figure 1:
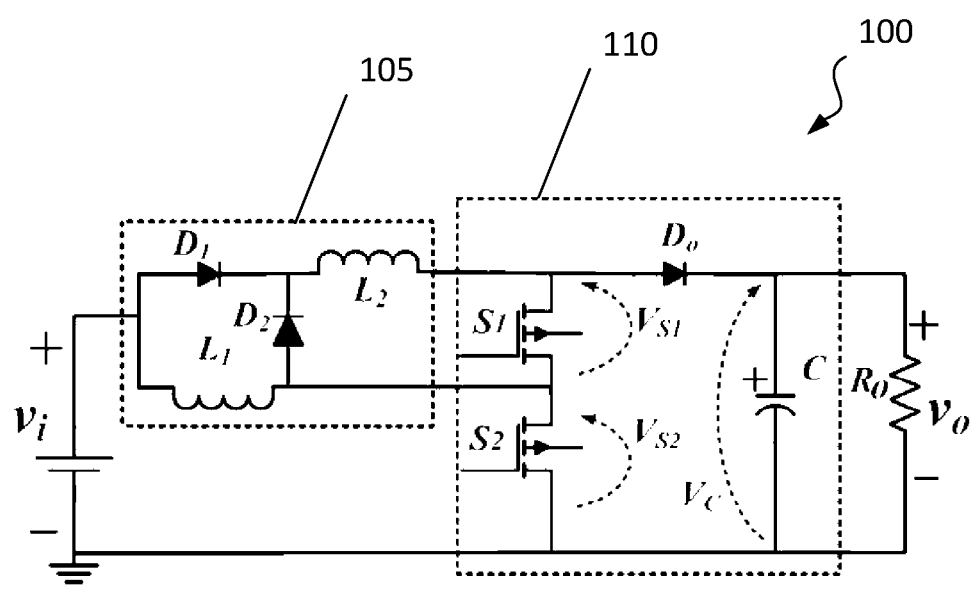
FIG. 1 illustrates an example of a power circuit diagram of a switched inductor-boost ("SI-B") converter according to an embodiment.

FIG. 1 illustrates an example power circuit 100 of an SI-B converter according to an embodiment. The power circuit 100 may include switched inductor 105 and load end structure 110. According to certain embodiments, the power circuit may be made up of two active switches $S_1$ and $S_2$, three diodes $D_1$, $D_2$, and $D_o$, two inductors $L_1$ and $L_2$, and load $R_o$.

The voltage conversion ratio of the SI-B converter according to certain embodiments may be substantially the same as or similar to the conventional transformer-less high step-up converter and may use substantially the same or similar number of components. However, the voltage stress across switches provided by certain embodiments of the proposed SI-B Converter may be lower when compared to the conventional transformer-less SI-B Converter or single switch SI-B converter. Therefore, compared to the transformer-less SI-B converter, certain embodiments of the proposed SI-B Converter may use low voltage rating semiconductor devices, allowing for lower power circuit cost. For example, the cost of the SI-B converter circuit according to certain embodiments can be lower because high voltage rating active switches and diodes are replaced by two low voltage rating active switches that are less expensive. It is worth noting that the total cost of the circuitry is low even though certain embodiments describe using two active switches in the proposed SI-B Converter instead of one, because the operation of the SI-B converter may allow triggering of the two switches by the same switching pulse from a single driver.

The circuit arrangement shown in FIG. 1 may be employed by certain embodiments with modifications to the power circuit and may be distinct from power circuits of conventional transformer-less high step-up DC-DC converters. An advantage of the circuit arrangement is that the total output voltage is distributed among the two active switches $S_1$ and $S_2$ and hence low voltage rating switches can be employed to design the power circuit of the DC-DC converter.

A DC-DC converter according to certain embodiments may utilize an inherent switched-inductor technique, in which two inductors with the same value of inductance are charged in parallel when both the active switches are turned ON and discharged in series when both the active switches are turned OFF. This technique can achieve high step-up voltage gain without utilizing a large number of inductors in the circuit.

In some embodiments, the operation of the SI-B converter may be divided into two modes: ON mode and OFF mode. ON mode is when both switches $S_1$ and $S_2$ are turned on, and OFF mode is when both switches $S_1$ and $S_2$ are turned off. During ON mode, inductor $L_1$ may be magnetized by input supply $v_i$ through switch $S_2$, inductor $L_2$ may be magnetized by input supply $v_i$ through diode $D_1$ and switches $S_1$ and $S_2$, and capacitor C may be discharged through the load. In ON mode, diode $D_2$ and $D_o$ may be reversed biased and the two inductors $L_1$ and $L_2$ may be charged in parallel from input supply $v_i$.

In OFF mode, both switches $S_1$ and $S_2$ are turned OFF, diode $D_1$ is reverse biased to the inductor voltage, and both inductors $L_1$ and $L_2$ are demagnetized in series with the input voltage providing energy to the load and charging capacitor C through diode $D_2$ and $D_o$.

Figure 2:
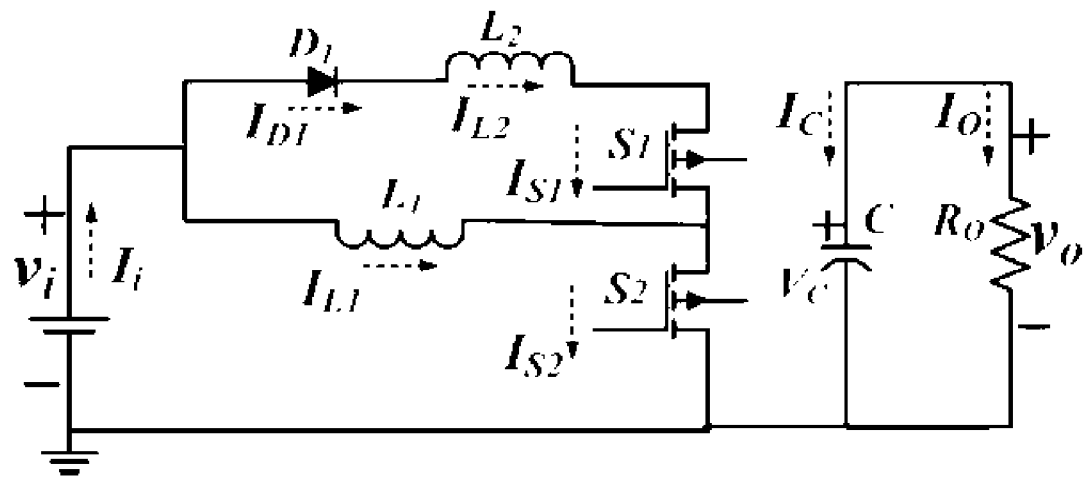
FIG. 2 illustrates an example of an equivalent circuit diagram of a SI-B converter for an ON mode of operation according to an embodiment.
Figure 3:
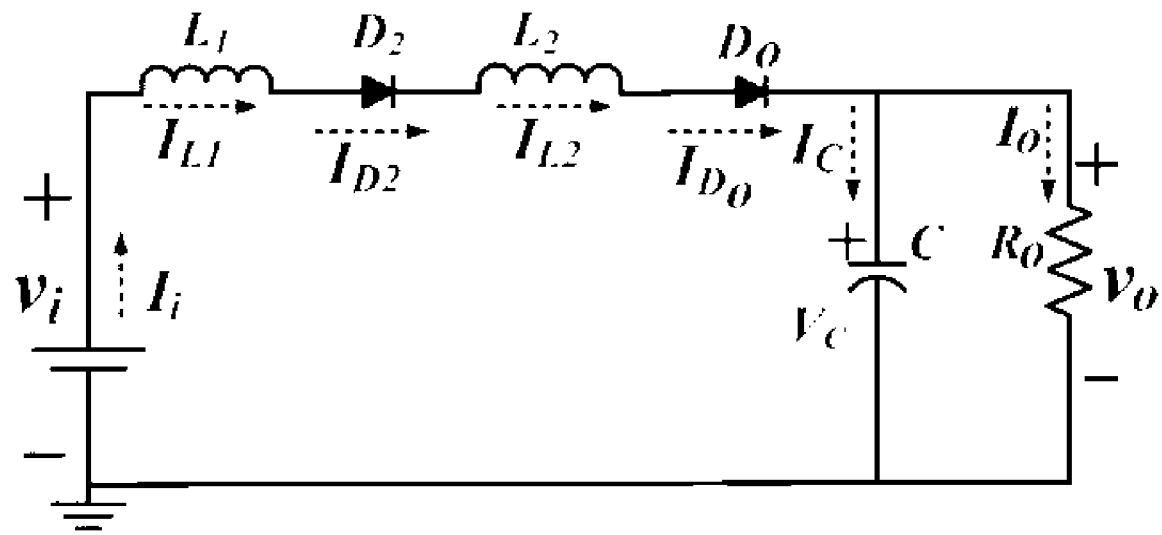
FIG. 3 illustrates an example of an equivalent circuit diagram of a SI-B converter for an OFF mode of operation according to an embodiment.

An example of an equivalent circuit for ON mode is shown in FIG. 2 and an example of an equivalent circuit for OFF mode is shown in FIG. 3. In FIGS. 2 and 3, $I_i$ is an input current, $I_{L1}$ and $I_{L2}$ are the currents through inductors $L_1$ and $L_2$, respectively, and $I_{S1}$ and $I_{S2}$ are the currents through switches $S_1$ and $S_2$, respectively. The current through diodes $D_1$, $D_2$, and $D_o$ are illustrated as $I_{D1}$, $I_{D2}$, and $I_{DO}$; $I_C$ is the current through capacitor C, and $I_O$ is the current through load $R_O$.

To analyze the steady-state characteristics of the SI-B converter, according to certain embodiments, all components are considered ideal, and the voltage drop across semiconductor devices due to ON mode resistance may be neglected since the capacitor is large enough to provide ripple free voltage.

In an embodiment, the average inductor and capacitor voltage when switches $S_1$ and $S_2$ are turned ON may be calculated by Equation (1).

$$\left. \begin{array}{l} V_{L1} = V_i \\ V_{L2} = V \\ V_C = V_O \end{array} \right\} \quad (1)$$

In an embodiment, the average inductor and capacitor current when switches $S_1$ and $S_2$ are turned ON may be calculated by Equation (2).

$$\left. \begin{array}{l} I_{L1} = I_i/2 \\ I_{L2} = I_i/2 \\ I_C = -I_O \end{array} \right\} \quad (2)$$

In an embodiment, the average inductor and capacitor voltage when switches $S_1$ and $S_2$ are turned OFF may be calculated by Equation (3).

$$\left. \begin{array}{l} V_{L1} = V_i - V_O/2 \\ V_{L2} = V_i - V_O/2 \\ V_C = V_i - V_{L1} - V_{L2} = V_O \end{array} \right\} \quad (3)$$

In an embodiment, the average inductor and capacitor current when switches $S_1$ and $S_2$ are turned OFF may be calculated by Equation (4).

$$\left. \begin{array}{l} I_{L1} = I_i \\ I_{L2} = I_i \\ I_C = I_i - I_O \end{array} \right\} \quad (4)$$

Figure 4:
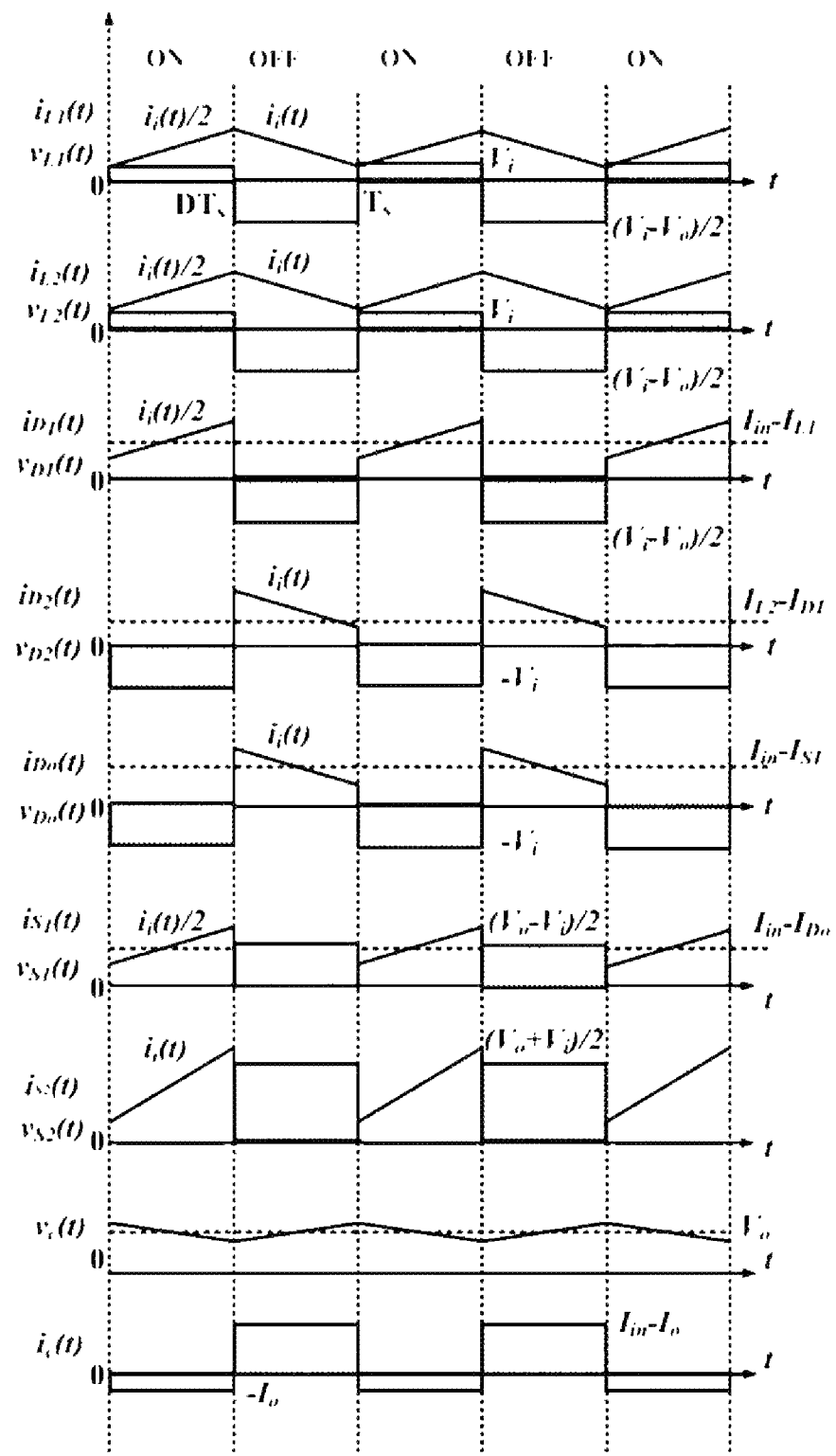
FIG. 4 illustrates an example of a continuous conduction mode typical characteristics waveform diagram of a SI-B Converter of an embodiment.

FIG. 4 illustrates an example waveform diagram of various typical characteristics of an SI-B converter according to certain embodiments. In the example of FIG. 4, $T_s$ represents the time period of one switching cycle, and $D_{TS}$ or $T_{ON}$ represents time period for ON mode.

In some embodiments, the output voltage of the SI-B converter may be obtained by Equation (5).

$$V_O = \frac{1+D}{1-D} V_i = \frac{T_S + T_{ON}}{T_S - T_{ON}} V_i \bigg\} \quad (5)$$

In some embodiments, the voltage may be obtained by Equation (6).

$$VCR_{SI-B} = \frac{V_O}{V_i} = \frac{1+D}{1-D} = \frac{T_S + T_{ON}}{T_S - T_{ON}} \bigg\} \quad (6)$$

In an embodiment, the voltage stress and current stress for active switches may be calculated by Equation (7).

$$\left. \begin{array}{l} V_{S1} = \frac{D}{1-D} V_i \\ V_{S2} = \frac{1}{1-D} V_i \\ I_{S1} = \frac{I_i}{2} \\ I_{S2} = I_i \end{array} \right\} \quad (7)$$

In an embodiment, the normalized voltage stress for active switches may be calculated by Equation (8).

$$\left. \begin{array}{l} V_{S1(Normalized)} = \frac{D}{1+D} \\ V_{S2(Normalized)} = \frac{1}{1+D} \end{array} \right\} \quad (8)$$

Figure 5:
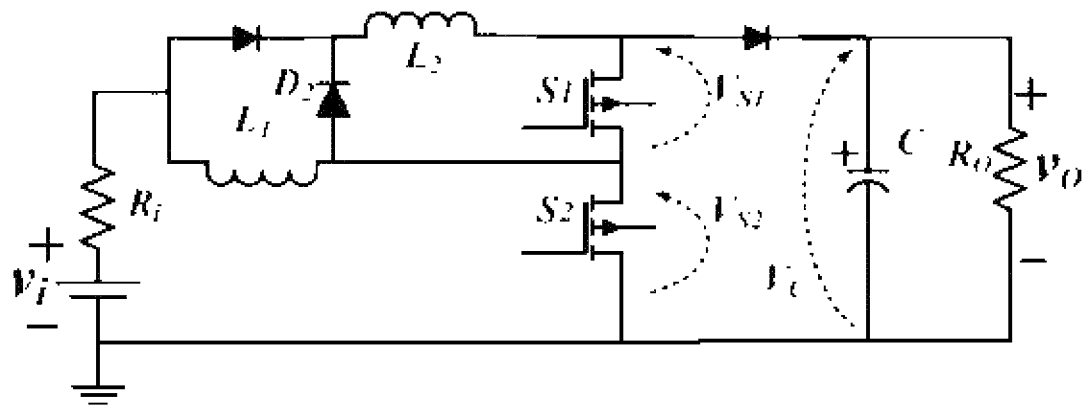
FIG. 5 illustrates an example of a power circuit diagram of a SI-B converter considering a non-ideality of input source according to an embodiment.

FIG. 5 illustrates an example circuit diagram of a SI-B converter with a non-ideal input source, according to certain embodiments. In order to analyze the non-ideality effect of a source, the internal resistance $R_i$ may be considered in series with a voltage supply, as shown in the example of FIG. 5. The voltage drop across $R_i$ may be represented by $V_{Ri}$. In this case, the output voltage $V_O$ and voltage conversion ratio $VCR_{SI-B}$ may be calculated by Equation (9).

$$\left. \begin{array}{l} V_O = \left(\frac{1+D}{1-D}\right) V_i - \left(\frac{1+D}{1-D}\right) V_{Ri} = \left(\frac{T_S + T_{ON}}{T_S - T_{ON}}\right) V_i - \left(\frac{T_S + T_{ON}}{T_S - T_{ON}}\right) V_{Ri} \\ VCR_{SI-B} = \frac{V_O}{V_i} = \left(\frac{1+D}{1-D}\right) - \left(\frac{1+D}{1-D}\right) \frac{V_{Ri}}{V_i} = \left(\frac{T_S + T_{ON}}{T_S - T_{ON}}\right) - \left(\frac{T_S + T_{ON}}{T_S - T_{ON}}\right) \frac{V_{Ri}}{V_i} \end{array} \right\} \quad (9)$$

Figure 6:
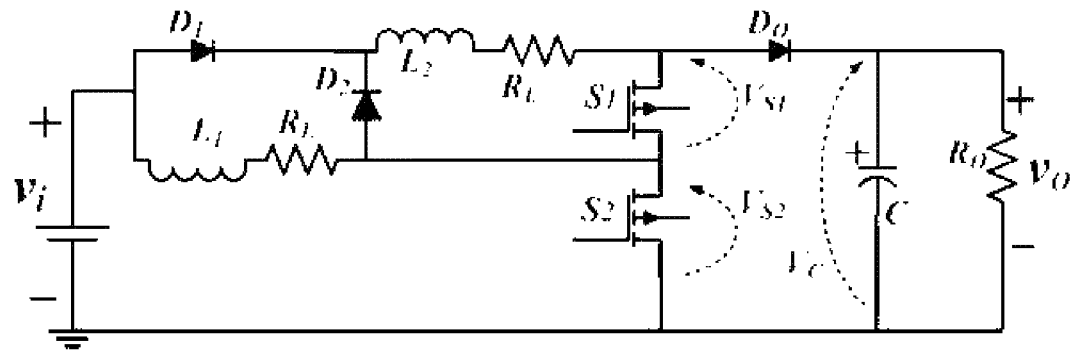
FIG. 6 illustrates an example of a power circuit diagram of a SI-B converter considering an effective series resistance of inductors according to an embodiment.

FIG. 6 illustrates an example circuit diagram of a SI-B converter with an effective series resistance of inductors, according to certain embodiments. In order to analyze the non-ideality effect of inductors, the effective series resistance $R_L$ may be considered in series with inductors $L_1$ and $L_2$, as shown in FIG. 6. The voltage drop across $R_L$ may be represented by $V_{RL}$. In this case, the output voltage and voltage conversion ratio in the worst case may be calculated by Equation (10).

$$\left. \begin{array}{l} V_O = \left(\frac{1+D}{1-D}\right) V_i - \left(\frac{2}{1-D}\right) V_{RL} = \left(\frac{T_S + T_{ON}}{T_S - T_{ON}}\right) V_i - \left(\frac{2T_S}{T_S - T_{ON}}\right) V_{RL} \\ VCR_{SI-B} = \frac{V_O}{V_i} = \left(\frac{1+D}{1-D}\right) - \left(\frac{2}{1-D}\right) \frac{V_{RL}}{V_i} = \left(\frac{T_S + T_{ON}}{T_S - T_{ON}}\right) - \left(\frac{2T_S}{T_S - T_{ON}}\right) \frac{V_{RL}}{V_i} \end{array} \right\} \quad (10)$$

Figure 7:
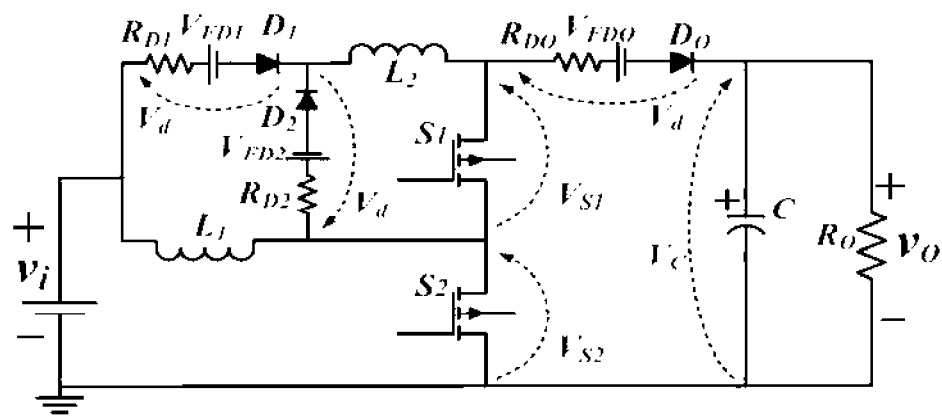
FIG. 7 illustrates an example of a power circuit diagram of a SI-B converter considering a non-ideality of diodes according to an embodiment.

FIG. 7 illustrates an example of a circuit diagram of a SI-B converter with non-ideality of diodes, according to an embodiment. In order to analyze the non-ideality effect of diodes, a forward resistance and a series threshold voltage source are considered as the non-ideality of diodes, as shown in the example of FIG. 7. The total voltage drop across each diode may be represented by $V_d$. In this case, the output voltage and voltage conversion ratio including consideration of inductor charging voltage $V_i - V_d$ may be calculated by Equation (11).

$$V_O \simeq \left(\frac{1+D}{1-D}\right)V_i - \left(\frac{2-D}{1-D}\right)V_d \simeq \left(\frac{T_S + T_{ON}}{T_S - T_{ON}}\right)V_i - \left(\frac{2T_s - T_{ON}}{T_S - T_{ON}}\right)V_d$$

$$VCR_{SI-B} \simeq \frac{V_O}{V_i} = \left(\frac{1+D}{1-D}\right) - \left(\frac{2T_s - T_{ON}}{1-D}\right)\frac{V_d}{V_i} \approx \left(\frac{T_S + T_{ON}}{T_S - T_{ON}}\right) - \left(\frac{2T_s - T_{ON}}{T_S - T_{ON}}\right)\frac{V_d}{V_i}$$

(11)

Figure 8:
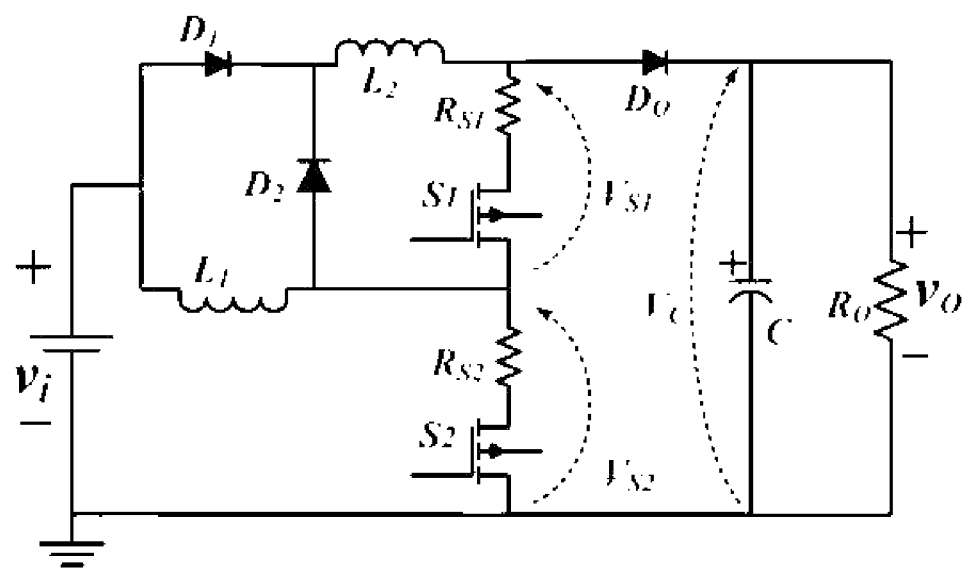
FIG. 8 illustrates an example of a power circuit diagram of a SI-B converter considering an ON-state resistance of active switches according to an embodiment.

FIG. 8 illustrates an example of a circuit diagram of a SI-B converter with ON mode resistance of active switches, according to an embodiment. In order to analyze the non-ideality effect of active switches, ON-mode resistance $R_s$ may be considered the non-ideality effect of active switches as shown in the example of FIG. 8. The total voltage drop across the switches may be represented by $V_s$. In this case, the output voltage and voltage conversion ratio including consideration of inductor charging voltage $V_i - 2V_s$ may be calculated by Equation (12).

$$V_O \simeq \left(\frac{1+D}{1-D}\right)V_i - \left(\frac{3D}{1-D}\right)V_s \simeq \left(\frac{T_S + T_{ON}}{T_S - T_{ON}}\right)V_i - \left(\frac{3T_{ON}}{T_S - T_{ON}}\right)V_s$$

$$VCR_{SI-B} \simeq \frac{V_O}{V_i} = \left(\frac{1+D}{1-D}\right) - \left(\frac{3D}{1-D}\right)\frac{V_s}{V_i} \approx \left(\frac{T_S + T_{ON}}{T_S - T_{ON}}\right) - \left(\frac{3T_{ON}}{T_S - T_{ON}}\right)\frac{V_s}{V_i}$$

(12)

Figure 9:
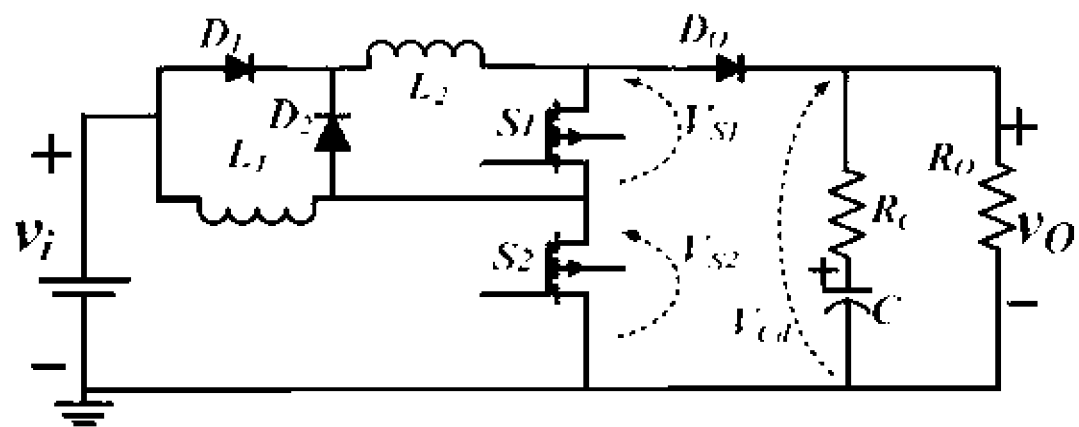
FIG. 9 illustrates an example of a power circuit diagram of a SI-B converter considering an effective series resistance of capacitor according to an embodiment.

FIG. 9 illustrates an example of a circuit diagram of a SI-B converter with an effective series capacitor resistance, according to an embodiment. In order to analyze the non-ideality effect of a capacitor, the effective series resistance of capacitor $R_c$ may be considered the non-ideality effect of the active switches, as shown in the example of FIG. 8. The total voltage drop across the resistance is represented by $V_{Cd}$. In this case, the output voltage and voltage conversion ratio may be calculated by Equation (13).

$$V_O \simeq \left(\frac{1+D}{1-D}\right)V_i - V_{Cd} \simeq \left(\frac{T_S + T_{ON}}{T_S - T_{ON}}\right)V_i - V_{Cd}$$

$$VCR_{SI-B} \simeq \frac{V_O}{V_i} = \left(\frac{1+D}{1-D}\right) - \frac{V_{Cd}}{V_i} \approx \left(\frac{T_S + T_{ON}}{T_S - T_{ON}}\right) - \frac{V_{Cd}}{V_i}$$

(13)

In Table 1, a comparison is provided in terms of losses and number of components in order to illustrate some examples of the various benefits of the proposed SI-B converter over the conventional transformer-less high step-up converter.

TABLE 1

| Configuration | Ideal Voltage Gain | The Effect of Non-Ideality of Components and Devices on the Voltage Conversion Ratio | | | | Number of Components $N_I/N_D/N_S/N_C$* |
|---|---|---|---|---|---|---|
| | | Input Source | Inductor | Diodes | Active Switches | |
| Transformer-less High Step-up Converter | $-\left(\frac{1+D}{1-D}\right)$ | $-\left(\frac{1+D}{1-D}\right)\frac{V_{Ri}}{V_i}$ | $-\left(\frac{2}{1-D}\right)\frac{V_{RL}}{V_i}$ | $-\left(\frac{2}{1-D}\right)\frac{V_d}{V_i}$ | $-\left(\frac{2D}{1-D}\right)\frac{V_S}{V_i}$ | 2/4/1/1 |
| Proposed Converter | $-\left(\frac{1+D}{1-D}\right)$ | $-\left(\frac{1+D}{1-D}\right)\frac{V_{Ri}}{V_i}$ | $-\left(\frac{2}{1-D}\right)\frac{V_{RL}}{V_i}$ | $-\left(\frac{2-D}{1-D}\right)\frac{V_d}{V_i}$ | $-\left(\frac{3D}{1-D}\right)\frac{V_S}{V_i}$ | 2/3/2/1 |

Worst case is considered while analyzing the effect of these non-idealities for the proposed converter.

Figure 10:
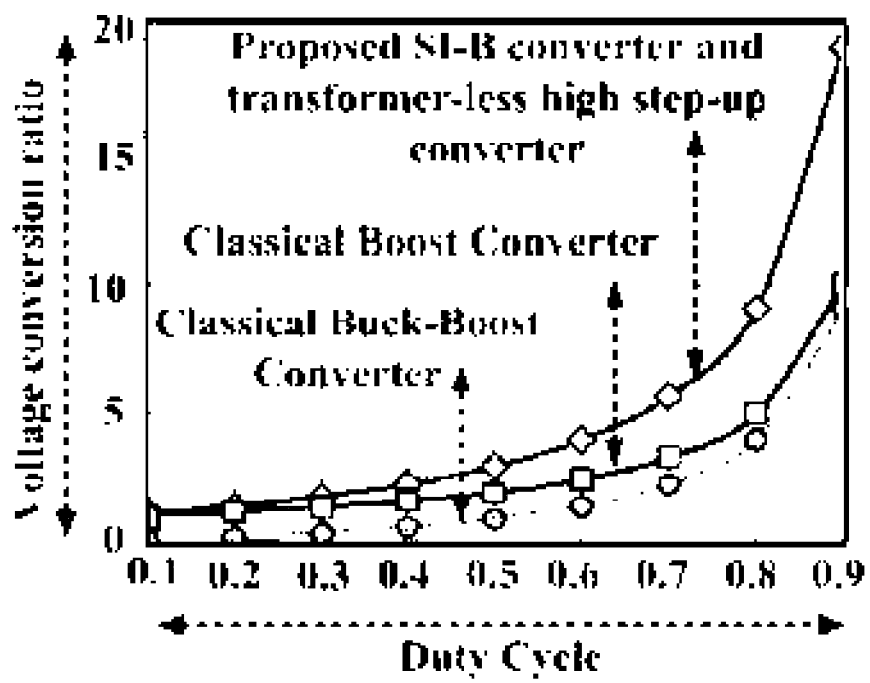
FIG. 10 illustrates a comparison graph of voltage conversion ratio with respect to a duty cycle of a SI-B Converter with classical boost converter, classical buck-boost converter, and transformer-less high step-up converter.

*$N_I$: Number of inductors, $N_D$: Number of diodes, $N_S$: Number of switches, $N_C$: Number of capacitors FIG. 10 illustrates a graphical comparison of devices with regards to voltage conversion ratio and duty cycle. Specifically, the voltage conversion ratio of the proposed SI-B converter, classical boost converter, classical buck-boost converter, and conventional transformer-less high step-converter is graphically compared in FIG. 10. It is observed that, in some embodiments, the voltage conversion ratio of the proposed SI-B converter is higher than the voltage conversion ratio of the classical boost and buck-boost converter, and is equal to the voltage conversion ratio of the transformer-less high step-up converter.

Figure 11:
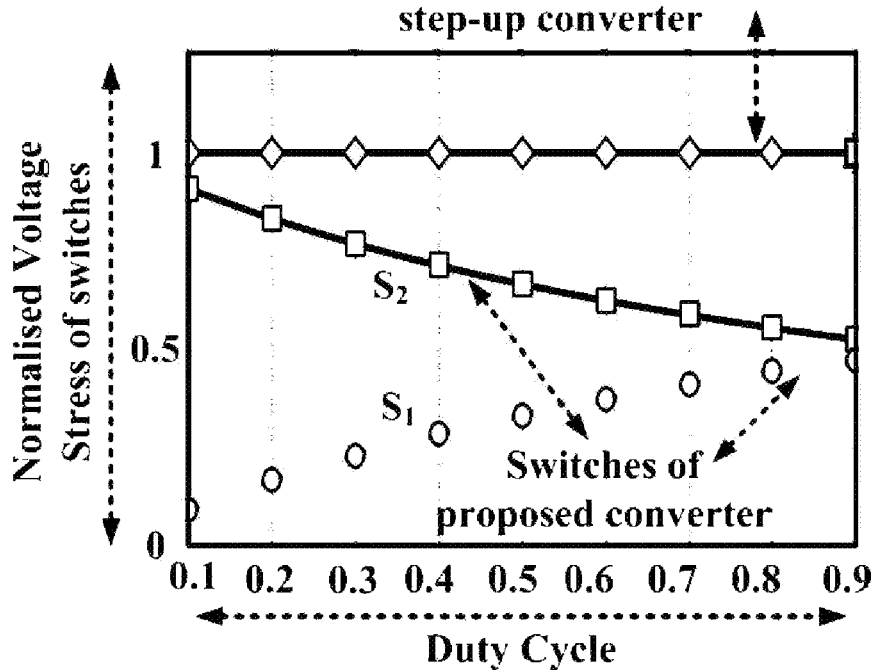
FIG. 11 illustrates a comparison graph of normalized voltage stress of switches with respect to a duty cycle of a SI-B converter with classical boost converter, classical buck-boost converter, and transformer-less high step-up converter.

FIG. 11 illustrates a graphical comparison of devices with regards to normalized voltage stress of switches and duty cycle. Specifically, the normalized voltage stress for active switches of the proposed SI-B, classical boost, classical buck-boost, and transformer-less high step-up converter are graphically compared. FIG. 11 shows that, according to certain embodiments, the voltage stress in the proposed converter is less than in those of the other devices. Hence, low voltage active switches can be selected to design the proposed converter, according to certain embodiments.

It is worth noting that, although the voltage rating of active switches is reduced, the ratings of the two active switches are not necessarily the same. The rating of switch $S_2$ may be higher than switch $S_1$ by a factor of $$\frac{V_{S1}}{D}.$$

Additionally, two inductors with asymmetrical ratings may affect the slope of the voltage and current waveforms. Thus, in some embodiments, the two inductors $L_1$ and $L_2$ should have the same ratings. The voltage rating of diode $D_O$ may be equal to the output voltage, and the voltage ratings of the uncontrolled devices (diodes) may not necessarily be the same.

In some embodiments, the performance and functionality of the proposed SI-B converter configuration may be validated through experimental investigation with parameters of, for example, output voltage 400V, input voltage 105V, power 500 W, and switching frequency 100 kHz. It is noted that this is merely one example and various other examples may be applied according to other embodiments.

Figure 12:
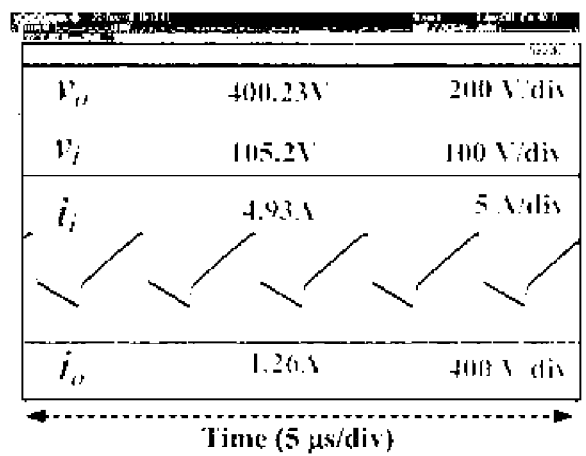
FIG. 12 illustrates an example of experimental waveform diagram of output voltage, output current, input voltage, and input current of a SI-B converter of an embodiment.

FIG. 12 illustrates an experimental waveform of output voltage, output current, input voltage, and input current. In this example, the two gate pulses with 60% duty cycles are generated through at least one field programmable gate array to control active switches $S_1$ and $S_2$. The obtained wave forms of output voltage ($v_o$), output current ($i_o$), input voltage ($v_i$) and input current ($i_i$) are shown in FIG. 12.

The average observed value of output voltage ($V_o$) is 400.23V, output current ($I_o$) is 1.26 A, input voltage ($V_i$) is 105.2V, and input current ($I_i$) is 4.93 A. Based on the observed value, the efficiency of the designed prototype is 97.2%.

Figure 13:
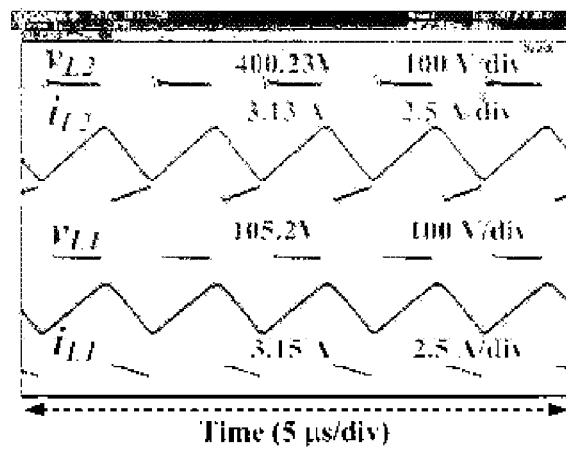
FIG. 13 illustrates an example of experimental waveform diagram of inductor $L_1$ voltage, and current, inductor $L_2$ voltage and current of a SI-B converter of an embodiment.

FIG. 13 illustrates another example experimental waveform of inductor $L_1$ voltage ($v_{L1}$) and current ($i_{L2}$), inductor $L_2$ voltage ($v_{L2}$) and current ($i_{L2}$).

In this example, the average observed value of inductor $L_1$ voltage (vii) is 0.57V and current ($i_{L2}$) is 3.14 A, inductor $L_2$ voltage ($v_{L2}$) is 0.43V and current ($i_{L2}$) is 3.13 A. It is also observed that both the inductors $L_1$ and $L_2$ are charged during ON mode with 105.2V and discharged with average voltage 151.3V.

Figure 14:
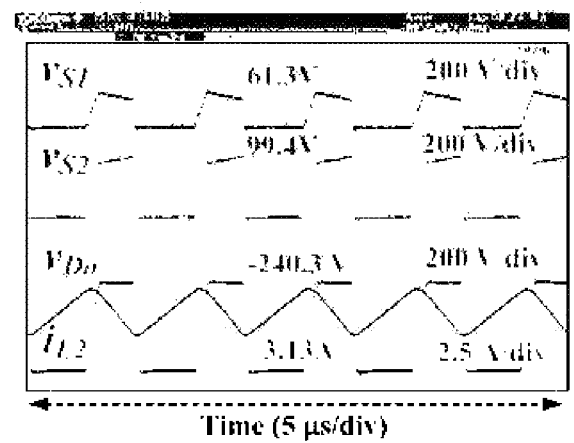
FIG. 14 illustrates an example of experimental waveform diagram of voltage across switch $S_1$, voltage across switch $S_2$, voltage across diode $D_o$, and inductor $L_2$ current of a SI-B converter of an embodiment.

FIG. 14 illustrates another experimental waveform example, the two gate pulses with 60% duty cycles are generated through at least one field programmable gate array to control active switches $S_1$ and $S_2$. The obtained wave forms voltage across switch $S_1$, voltage across switch $S_2$, voltage across diode $D_o$, and inductor $L_2$ current ($i_{L2}$) are shown in FIG. 14.

In the example of FIG. 14, the average observed value of voltage across switch $S_1$ is 61.3V, voltage across switch $S_2$ is 99.4V, and voltage across diode $D_o$ is −240.3V. It is noticeable that during OFF mode, the peak voltage across switch $S_1$ and $S_2$ is 151.3 V and 251.2V, respectively. It is also worth noting that the voltage stress across both the switches $S_1$ and $S_2$ is less than the output voltage, which may be advantageous. The voltage rating of the switches may be lower than the output voltage, as opposed to the voltage rating of transformer high step-up DC-DC converter which would be equal to the output voltage. Therefore, the cost of the converter may be reduced due to the use of lower rating active switches.

It is foreseeable to add advanced boosting techniques to improve the performance of certain embodiments with reduced current stress or double duty concept.

Certain embodiments disclosed in this description may be used, for example, in applications such as DC micro grids, DC-DC charger, battery backup system, uninterruptible power supply, electric vehicles, and electric utility grid, as well as other applications.

Generally, photovoltaic or fuel cell applications require DC-DC converters with high voltage conversion ratios. The SI-B converter provided by example embodiments may be suitable to convert generated low PV voltage to higher voltage level where low voltage active switches may be necessary. The SI-B converter provided by certain embodiments is also suitable to feed auxiliary loads in electric and hybrid electric vehicles, control the speed of electric DC drives, and feed individual stages of multilevel inverters for higher voltage levels, for example. The SI-B converter provided by certain embodiments may also be employed in electric vehicles for conversion of low to required voltage levels, and may also be used in stages of modular multilevel converters for extra high voltage DC generation, high voltage electric vehicles or trains, DC homes, high voltage automotive applications, military applications, and telecommunication applications, for example.

Although the foregoing description is directed to example embodiments of the invention, it is noted that other variations and modifications will be apparent to those skilled in the art, and may be made without departing from the spirit or scope of the invention. Moreover, features described in connection with one embodiment may be used in conjunction with other embodiments, even if not explicitly stated above.

We claim:

1. A DC-DC converter comprising:
   two inductors;
   two active switches;
   an input supply;
   a capacitor;
   a first diode;
   a second diode;
   a third diode; and
   a load,
   wherein the two inductors are configured to magnetize in parallel when the two active switches are turned on, and the two inductors are configured to demagnetize in series when the two active switches are turned off, wherein a first inductance value of a first inductor of the two inductors and a second inductance value of a second inductor of the two inductors are substantially equivalent, wherein the first inductor is configured to be magnetized by the input supply through a second active switch of the two active switches, the second inductor is configured to be magnetized by the input supply through the first diode and both active switches, and the second inductor and the first diode are connected in series when the two active switches are turned on, and wherein the first inductor and the second inductor are demagnetized in series with the input supply to provide energy to the load and charge the capacitor through the second diode and the third diode when the two active switches are turned off.

2. The converter according to claim 1,
wherein a second switch voltage rating of a second active switch of the two active switches is configured to be higher than a first switch voltage rating of a first active switch of the two active switches, and
wherein the second switch voltage rating and the first switch voltage rating are less than an output voltage.

3. The converter according to claim 1, wherein an output voltage is configured to be distributed among the two active switches when the active switches are turned off.

4. The converter according to claim 1,
wherein the two active switches are configured to be simultaneously turned on and off, and arranged in a half-bridge structure, and
wherein a single half-bridge driver is configured to drive the two active switches.

5. The converter according to claim 1,
wherein the second diode and the third diode are configured to be reversed biased, and the first diode is configured to be forward biased when the two active switches are turned on, and
wherein the first diode is configured to be reversed biased, and the second diode and the third diode are configured to be forward biased when the two active switches are turned off.

6. The converter according to claim 5,
wherein a voltage rating of the third diode is configured to be equal to an output voltage, and
wherein a voltage rating of the first diode and a voltage rating of the second diode are configured to be less than the output voltage.

7. The converter according to claim 5, wherein a voltage rating of the first diode, a voltage rating of the second diode, and a voltage rating of the third diode are different.

8. A method comprising:
providing a DC-DC converter comprising two inductors and two active switches;
charging the two inductors in parallel when the two active switches are turned on;
discharging the two inductors in series when the two active switches are turned off;
magnetizing a first inductor of the two inductors with an input supply through a second active switch of the two active switches;
magnetizing a second inductor of the two inductors with the input supply through a first diode, when the two active switches are turned on; and
demagnetizing the first inductor in series with the second inductor and the input supply to provide energy to a load and charge the capacitor through a second diode and a third diode when the two active switches are turned off,
wherein a first inductance value of the first inductor and a second inductance value of the second inductor are substantially equivalent, and
wherein the second inductor and the first diode are connected in series when the two active switches are turned on.

9. The method according to claim 8, further comprising:
controlling the two active switches with a single driver.

10. The method according to claim 8, further comprising:
distributing an output voltage among the two active switches when the active switches are turned off.

11. The method according to claim 8, wherein a second switch voltage rating of the second active switch is higher than a first switch voltage rating of a first active switch of the two active switches.

12. The method according to claim 8, further comprising:
reversed biasing the second diode and the third diode when the two active switches are turned on; and
reversed biasing the first diode when the two active switches are turned off.

13. The method according to claim 12, wherein a voltage rating of the first diode, a voltage rating of the second diode, and the voltage rating of the third diode are different.

14. The method according to claim 13, wherein a voltage rating of the third diode is equal to an output voltage, and a voltage rating fo the first diode and the second diode are less than an output voltage.

* * * * *